(12) United States Patent
Long

(10) Patent No.: US 10,741,971 B2
(45) Date of Patent: Aug. 11, 2020

(54) ELECTRICAL CONNECTOR ASSEMBLY

(71) Applicant: LOTES CO., LTD., Keelung (TW)

(72) Inventor: Quan Long, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/540,258

(22) Filed: Aug. 14, 2019

(65) Prior Publication Data

US 2020/0067235 A1 Feb. 27, 2020

(30) Foreign Application Priority Data

Aug. 27, 2018 (CN) .......................... 2018 1 0979954
Sep. 3, 2018 (CN) .......................... 2018 1 1018363

(51) Int. Cl.
| | |
|---|---|
| *H01R 13/652* | (2006.01) |
| *H01R 12/71* | (2011.01) |
| *H01R 13/02* | (2006.01) |
| *H01R 13/46* | (2006.01) |

(52) U.S. Cl.
CPC ......... *H01R 13/652* (2013.01); *H01R 12/716* (2013.01); *H01R 13/02* (2013.01); *H01R 13/46* (2013.01)

(58) Field of Classification Search
CPC ...... H01R 13/652; H01R 13/02; H01R 13/46; H01R 12/716
USPC .......................................................... 439/92
See application file for complete search history.

(56) References Cited

U.S. PATENT DOCUMENTS

| | | | | |
|---|---|---|---|---|
| 6,322,392 B1 * | 11/2001 | Wang | ................. | H01R 13/6595 439/607.14 |
| 6,623,302 B2 * | 9/2003 | Billman | ............... | H01R 13/514 439/607.07 |
| 6,648,657 B1 * | 11/2003 | Korsunsky | ......... | H01R 13/6594 439/108 |
| 7,029,330 B1 * | 4/2006 | Ro | ....................... | H01R 13/443 439/148 |
| 7,320,623 B2 * | 1/2008 | Hisamatsu | ......... | H01R 13/6485 439/108 |

(Continued)

FOREIGN PATENT DOCUMENTS

| | | |
|---|---|---|
| CN | 103138116 A | 6/2013 |
| CN | 203660186 U | 6/2014 |
| CN | 101960674 B | 8/2014 |

*Primary Examiner* — Harshad C Patel
(74) *Attorney, Agent, or Firm* — Locke Lord LLP; Tim Tingkang Xia, Esq.

(57) ABSTRACT

An electrical connector assembly is mated with a mating component. The electrical connector assembly includes a circuit board and a connector electrically connected to the circuit board. The connector includes an insulating body and a plurality of terminals. The terminals are fixed to the insulating body and include at least two ground terminals. Each of the ground terminals includes a contact section extending forward and a conducting section extending backward. The contact sections of the ground terminals are connected to each other through a first connecting sheet, and the conducting sections of the ground terminals are fixed to the circuit board and are electrically connected to each other through a path on the circuit board. Thus, multiple joint grounding paths are provided for the ground terminals, manufacturing is easy, and a high frequency effect can be remarkably improved.

20 Claims, 9 Drawing Sheets

(56) References Cited

U.S. PATENT DOCUMENTS

| | | | | |
|---|---|---|---|---|
| 7,384,310 B2* | 6/2008 | Hu | ............... | H01R 24/64 |
| | | | | 439/607.01 |
| 8,011,950 B2* | 9/2011 | McGrath | ............... | H01R 12/594 |
| | | | | 439/497 |
| 8,167,631 B2* | 5/2012 | Ito | ............... | H01R 24/38 |
| | | | | 439/108 |
| 8,342,886 B2 | 1/2013 | Zhang et al. | | |
| 8,764,460 B2* | 7/2014 | Smink | ............... | H01R 13/6597 |
| | | | | 439/92 |
| 8,764,464 B2* | 7/2014 | Buck | ............... | H01R 13/514 |
| | | | | 439/108 |
| 8,827,750 B2* | 9/2014 | Chung | ............... | H01R 13/6461 |
| | | | | 439/660 |
| 9,627,817 B2* | 4/2017 | Chang | ............... | H01R 13/6594 |
| 9,692,183 B2* | 6/2017 | Phillips | ............... | H01R 13/6471 |
| 9,881,650 B1* | 1/2018 | Sotome | ............... | G11B 33/122 |
| 2004/0235324 A1* | 11/2004 | Kimura | ............... | H01R 23/6873 |
| | | | | 439/108 |
| 2009/0221165 A1 | 9/2009 | Buck et al. | | |
| 2012/0315796 A1* | 12/2012 | Pang | ............... | H01R 13/6471 |
| | | | | 439/626 |
| 2014/0127942 A1 | 5/2014 | Chung et al. | | |

* cited by examiner

ELECTRICAL CONNECTOR ASSEMBLY

CROSS-REFERENCE TO RELATED PATENT APPLICATION

This non-provisional application claims priority to and the benefit of, pursuant to 35 U.S.C. § 119(a), patent application Serial No. CN201810979954.X filed in China on Aug. 27, 2018, and patent application Serial No. CN201811018363.2 filed in China on Sep. 3, 2018. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector assembly, and particularly to an electrical connector assembly capable of improving high frequency characteristics.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, an electrical connector is widely applied in various fields, and requirements on the electrical connector become higher, particularly in the requirement to increase the transmission speed of the electrical connector. In the process of increasing the transmission speed, it is crucial as to how to resolve a crosstalk problem of the electrical connector and to provide a good shielding effect and a grounding path for the electrical connector.

A conventional electrical connector is soldered to a circuit board, and generally includes an insulating body and terminals accommodated in the insulating body. In order to improve high frequency characteristics, multiple of ground terminals are generally provided, and are respectively provided at positions adjacent to signal terminals. However, the ground terminals are respectively soldered to the circuit board generally, and are provided at intervals and thus are not connected. Therefore, there are no joint grounding paths between the ground terminals, resulting in a poor grounding effect, and it is difficult to achieve an ideal effect of resolving a high frequency problem.

Therefore, a heretofore unaddressed need to design a new electrical connector assembly exists in the art to address the aforementioned deficiencies and inadequacies.

SUMMARY

The present invention is directed to an electrical connector assembly capable of improving high frequency characteristics.

In order to achieve the foregoing objective, the present invention adopts the following technical solutions:

An electrical connector assembly is mated with a mating component. The electrical connector assembly includes: a circuit board; and a connector, electrically connected to the circuit board, wherein the connector comprises an insulating body and a plurality of terminals, the terminals are fixed to the insulating body and comprise at least two ground terminals, each of the ground terminals comprises a contact section extending forward and a conducting section extending backward, the contact sections of the ground terminals are connected to each other through a first connecting sheet, and the conducting sections of the ground terminals are fixed to the circuit board and are electrically connected to each other through a path on the circuit board.

In certain embodiments, the first connecting sheet and the ground terminals are integrally formed.

In certain embodiments, the connector comprises a shell to accommodate the insulating body and the terminals, the shell has an insertion space and a reserved space located at one side of the insertion space, the insulating body is located behind the insertion space, the contact sections of the ground terminals extend forward from the reserved space to enter the insertion space, and the first connecting sheet is connected to a front end of each of the contact sections of the ground terminals and enters the insertion space.

In certain embodiments, a guide portion is provided in front of the reserved space, the guide portion and the reserved space are located at a same side of the insertion space, and a first gap is provided between the first connecting sheet and a rear surface of the guide portion.

In certain embodiments, the reserved space and the guide portion are located at an upper side of the insertion space, and a lowest point of a front end surface of the first connecting sheet is not lower than a lower surface of the guide portion.

In certain embodiments, the reserved space extends in a transverse direction, an end of the first connecting sheet in the transverse direction has a first protruding portion, and when the mating component is inserted into the insertion space, a second gap is provided between an inner wall surface of the reserved space located at an end thereof in the transverse direction and the first protruding portion.

In certain embodiments, the shell has a mounting portion, the conducting section of each of the ground terminals comprises a soldering portion and a tail portion extending from a rear end of the soldering portion, the tail portions of the ground terminals are connected to each other through a second connecting sheet, the second connecting sheet has a second protruding portion in a transverse direction, and a third gap is provided between the second protruding portion and the mounting portion in the transverse direction.

In certain embodiments, the contact section of each of the ground terminals comprises a second contact portion, the second contact portion is electrically connected to the mating component, and a thickness of the first connecting sheet is different from a thickness of the second contact portion.

In certain embodiments, the thickness of the first connecting sheet is greater than the thickness of the second contact portion.

In certain embodiments, the terminals comprise at least a pair of differential signal terminals, the differential signal terminals are located between two of the ground terminals, and the first connecting sheet is located in front of the differential signal terminals.

In certain embodiments, the terminals are arranged in an upper row and a lower row, each of the terminals in the upper row and the terminals in the lower row comprise at least two ground terminals, the contact sections of the at least two ground terminals in the upper row are connected to each other through a first connecting sheet in the upper row, the contact sections of the at least two ground terminals in the lower row are connected to each other through a first connecting sheet in the lower row, and the first connecting sheet located in the upper row and the first connecting sheet located in the lower row are symmetrically provided.

In certain embodiments, the circuit board has a plurality of first solder pads and a second solder pad, the conducting section of each of the ground terminals is correspondingly soldered to one of the first solder pads, and the first solder pads are electrically connected to each other through the second solder pad to provide the path.

In certain embodiments, the connector comprises a shell to accommodate the insulating body and the terminals, a rear end of the shell has a mounting portion, and the second solder pad is located in front of a rear end surface of the mounting portion.

In certain embodiments, the conducting sections of the ground terminals are connected to each other through a second connecting sheet, and the second connecting sheet is located on the second solder pad.

In certain embodiments, the conducting section of each of the ground terminals comprises a soldering portion and a tail portion extending from a rear end of the soldering portion, the tail portions of the ground terminals are connected to each other through a second connecting sheet, and an angle is formed between the second connecting sheet and the circuit board or the second connecting sheet is attached to a surface of the circuit board.

An electrical connector assembly is mated with a mating component. The electrical connector assembly includes: a circuit board; and a connector, electrically connected to the circuit board, wherein the connector comprises an insulating body and a plurality of terminals, the terminals are fixed to the insulating body and comprise at least two ground terminals, each of the ground terminals comprises a contact section extending forward and a conducting section extending backward, the contact sections of the ground terminals are connected to each other through a first connecting sheet, the conducting portions of the ground terminals are fixed to the circuit board, and the conducting sections of the ground terminals are connected to each other through a second connecting sheet and are electrically connected to each other through a path on the circuit board.

In certain embodiments, the conducting section of each of the ground terminals comprises a soldering portion and a tail portion extending from a rear end of the soldering portion, the tail portions of the ground terminals are connected to each other through the second connecting sheet, and the second connecting sheet is in contact with the circuit board.

In certain embodiments, the circuit board has a plurality of first solder pads and at least one second solder pad, each conducting section of each of the ground terminals is correspondingly soldered to one of the first solder pads, and the first solder pads are electrically connected to each other through the second solder pad so as to provide the path.

In certain embodiments, a width of the second solder pad is not less than a width of the second connecting sheet.

In certain embodiments, the contact section of each of the ground terminals comprises a second contact portion, the second contact portion is electrically connected to the mating component, and a thickness of the first connecting sheet is different from a thickness of the second contact portion.

Compared with the related art, in certain embodiments of the present invention, the first connecting sheet is provided at the front ends of the ground terminals, the second connecting sheet is provided on the conducting sections of the ground terminals, and the second solder pad is provided on the circuit board to electrically connect the first solder pads to which the ground terminals are soldered. Thus, multiple joint grounding paths are provided for the ground terminals, manufacturing is easy, and a high frequency effect can be remarkably improved.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
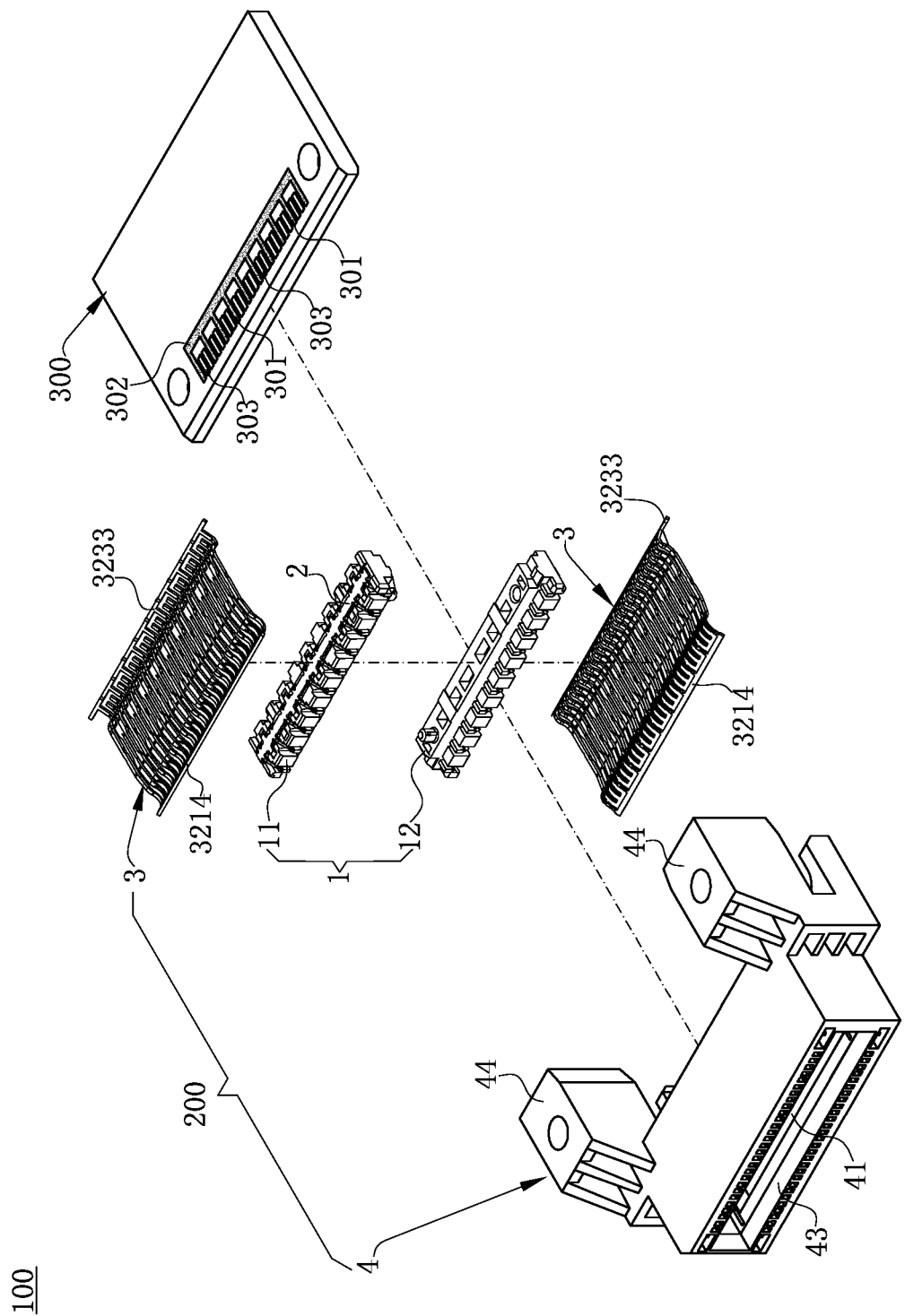
FIG. 1 is a perspective exploded view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector assembly.

FIG. 1 to FIG. 6 show an electrical connector assembly 100 according to a first embodiment of the present invention. The electrical connector assembly 100 is used to be mated with a mating component 400, and includes a circuit board 300 and a connector 200 soldered to the circuit board 300.

Figure 4:
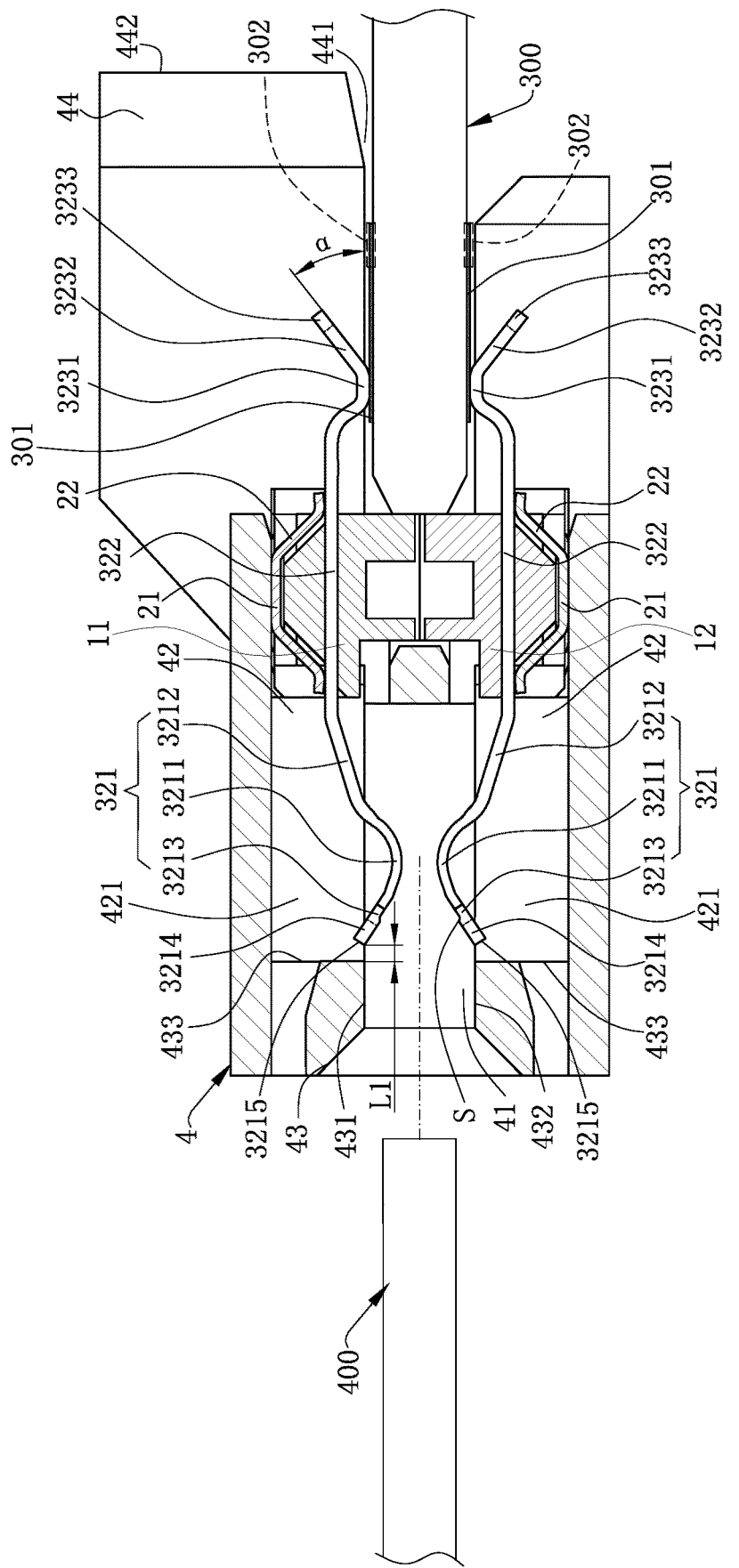
FIG. 4 is a sectional view of FIG. 3 in an A-A direction before a mating component is inserted thereto.

Referring to FIG. 1 and FIG. 4, the connector 200 has an insulating body 1, two grounding members 2, a plurality of terminals 3 and a shell 4. The insulating body 1 includes an upper insulating body 11 and a lower insulating body 12, and the upper insulating body 11 and the lower insulating body 12 are assembled in a vertical direction to form the insulating body 1.

Referring to FIG. 1 and FIG. 4, the two grounding members 2 are respectively fixed to the upper insulating body 11 and the lower insulating body 12, and each grounding member 2 has a base 21 and a plurality of elastic sheets 22 symmetrically extending from two opposite sides of the base 21.

Figure 2:
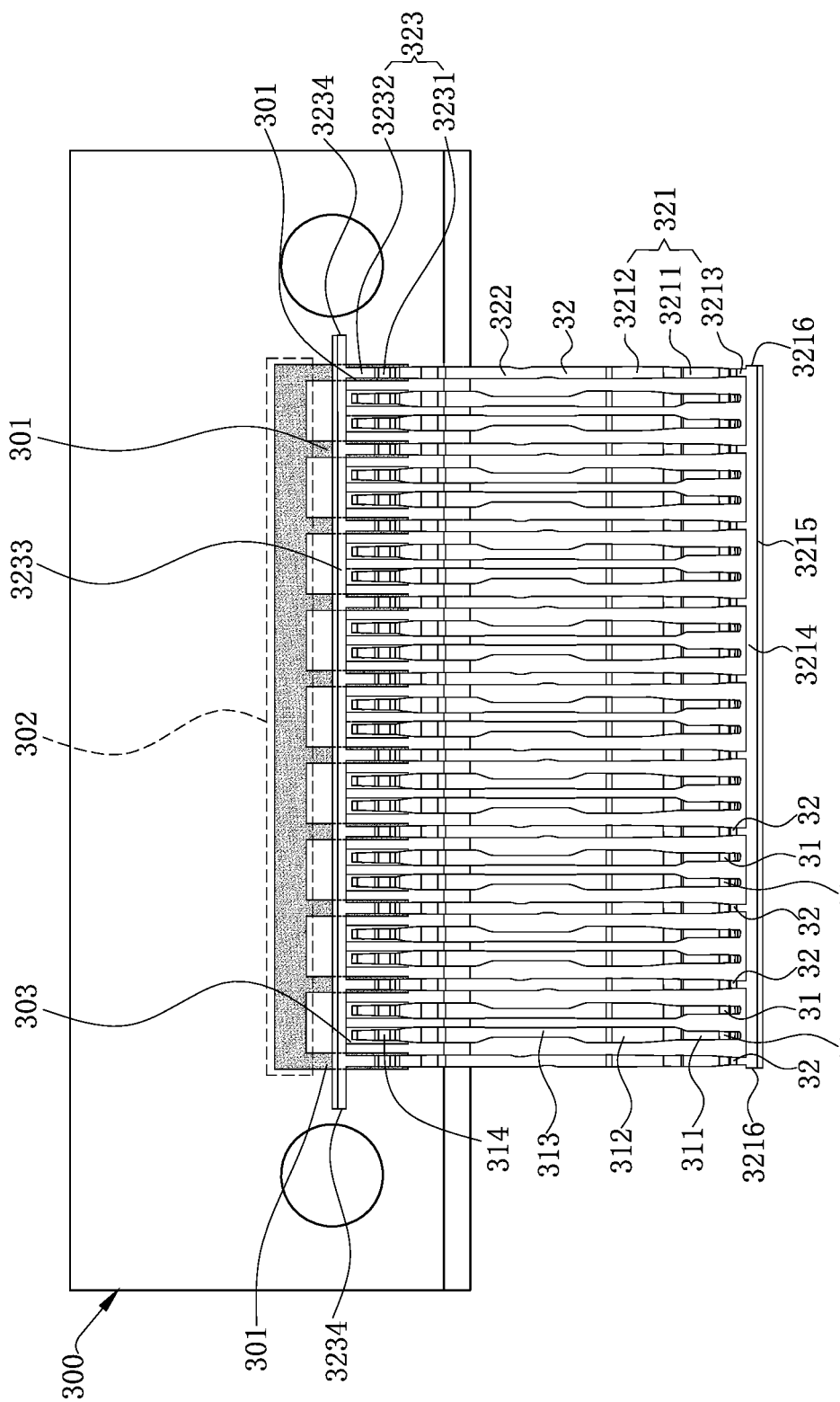
FIG. 2 is a top view of the first embodiment.
Figure 3:
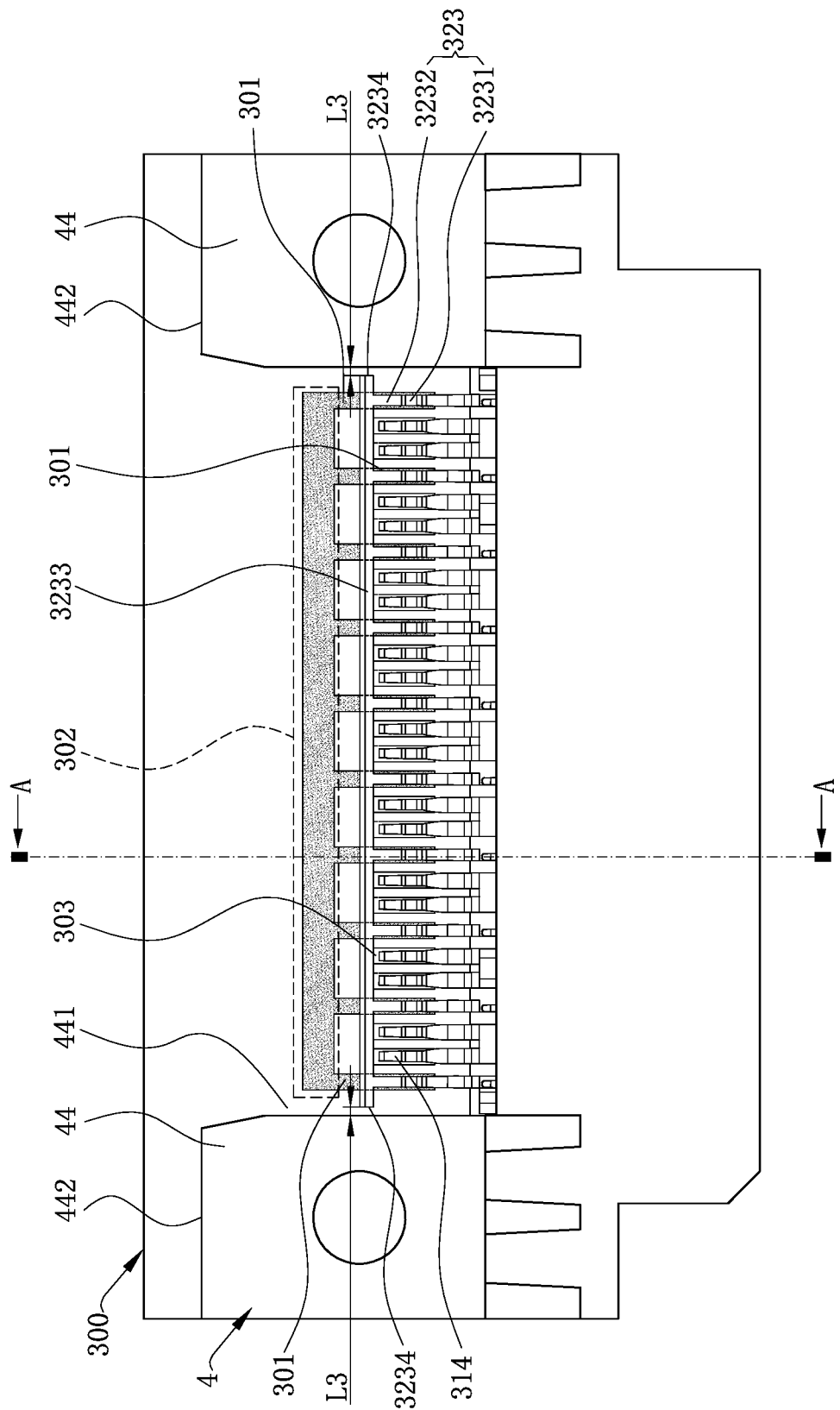
FIG. 3 is a top view of FIG. 1 after assembling is completed.

Referring to FIG. 1 to FIG. 3, the terminals 3 are divided into an upper row and a lower row and are arranged in a transverse direction, and the terminals 3 located in the upper row and the terminals 3 located in the lower row are respectively injection-molded in the upper insulating body 11 and the lower insulating body 12. The terminals 3 located in the upper row and the terminals 3 located in the lower row are symmetrically arranged and are identical in structure. Using the terminals 3 located in the upper row as an example, the terminals 3 include a plurality of pairs of differential signal terminals 31 and a plurality of ground terminals 32 arranged adjacent to the pairs of differential signal terminals 31. Each pair of differential signal terminals 31 are located between two ground terminals 32. Each differential signal terminal 31 includes a first contact portion 311 located in front thereof and a first connecting portion 312, a first retaining portion 313 and a first soldering portion 314 extending backward sequentially from the first contact portion 311. The first contact portion 311 is used for being in electrical contact with the mating component 400. The first connecting portion 312 is located in front of the upper insulating body 11, and a thickness of the first connecting portion 312 is greater than a thickness of the first contact portion 311. The first retaining portion 313 is retained in the upper insulating body 11, and the first soldering portion 314 extends backward out of the upper insulating body 11.

Referring to FIG. 1 to FIG. 5, using the terminals 3 located in the upper row as the example, each ground terminal 32 has a contact section 321 extending forward and a second retaining portion 322 and a conducting section 323 extending backward sequentially from the contact section 321. The contact section 321 includes a second contact portion 3211, a second connecting portion 3212 located behind the second contact portion 3211, and a head end 3213 bending upward from a front end of the second contact portion 3211. The second contact portion 3211 is in electrical contact with the mating component 400. The head end 3213 of each ground terminal 32 extends forward to pass beyond the first contact portion 311. Therefore, a length of each ground terminal 32 is greater than a length of each differential signal terminal 31. The head end 3213 is provided with a step portion S. Due to existence of the step portion S, a thickness of a front end of the head end 3213 is greater than a thickness of a rear end of the head end 3213 and a thickness of the second contact portion 3211. Meanwhile, the head ends 3213 of the ground terminals 32 are connected through a first connecting sheet 3214. A thickness of the first connecting sheet 3214 is the same as the thickness of a front end of the head end 3213. Therefore, the thickness of the first connecting sheet 3214 is also greater than the thickness of the second contact portion 3211. The first connecting sheet 3214 is a metal strip, which is formed in a stamping process, and the first connecting sheet 3214 and the ground terminals 32 are formed as an integrally-formed structure. In other embodiments, the first connecting sheet 3214 can be made of other conductive materials. The first connecting sheet 3214 and the head ends 3213 are located on different planes, and the first connecting sheet 3214 is located in front of the first contact portion 311. The first connecting sheet 3214 has a front end surface 3215. The first connecting sheet 3214 extends in a transverse direction, and each of two ends of the first connecting sheet 3214 in the transverse direction has a first protruding portion 3216. Each first protruding portion 3216 is adjacent to the front end surface 3215. The second connecting portion 3212 is located in front of the upper insulating body 11. The second retaining portion 322 is retained to the upper insulating body 11. The elastic sheets 22 are in contact with the second retaining portion 322 of a same ground terminal 32. The conducting section 323 extends backward out of the upper insulating body 11. The conducting section 323 includes a second soldering portion 3231 and a tail portion 3232 bending upward from a rear end of the second soldering portion 3231, and the tail portion 3232 extends backward to pass beyond the first soldering portion 314. The tail portions 3232 of the ground terminals 32 are connected through a second connecting sheet 3233. A thickness of the second connecting sheet 3233 is the same as a thickness of the conducting section 323. The second connecting sheet 3233 is also a metal strip, and the second connecting sheet 3233 and the tail portions 3232 are located in different planes. The second connecting sheet 3233 extends in the transverse direction, and each of two ends of the second connecting sheet 3233 in the transverse direction has a second protruding portion 3234. The structures of the terminals 3 located in the lower row as well as the first connecting sheet 3214 and the second connecting sheet 3233 and the structures of the terminals 3 in the upper row as well as the first connecting sheet 3214 and the second connecting sheet 3233 are identical, and are symmetrically arranged about a virtual center line C.

Referring to FIG. 3 and FIG. 4, when the connector 200 does not mate with the mating component 400, the shell 4 accommodates the insulating body 1, the grounding members 2 and the terminals. The shell 4 has an insertion space 41, two reserved spaces 42, two guide portions 43 and two mounting portions 44. The insertion space 41 is recessed backward from a front surface of the shell 4 and is located in the center of the shell 4, and the first contact portion 311 is located in the insertion space 41. The two reserved spaces 42 are respectively located at an upper side and a lower side of the insertion space 41. For each terminal 3, the second connecting portion 3212 protrudes forward out of the insulating body 1 to enter a corresponding reserved spaces 42, the second contact portion 3211 extends forward from a front end of the second connecting portion 3212 to enter the insertion space 41, and the head end 3213 extends in a direction of the corresponding reserved space 42 from the second contact portion 3211. Each reserved space 42 extends in the transverse direction, and each of the two ends thereof in the transverse direction has a left inner wall surface 421 and a right inner wall surface 422. The first connecting sheet 3214 is partially located in the corresponding reserved space 42. The two guide portions 43 are respectively located at an upper side and a lower side of the insertion space 41 and are respectively located in front of the reserved spaces 42. The guide portion 43 located at the upper side has a lower surface 431, the guide portion 43 located at the lower side has an upper surface 432, and each of the guide portions 43 has a rear surface 433 facing the corresponding reserved space 42. A first gap L1 is provided between a lowest point of a front end surface 3215 of the first connecting sheet 3214 located at the upper side and the rear surface 433 of the guide portion 43 located at the upper side. Similarly, a first gap L1 is provided between a highest point of a front end surface 3215 of the first connecting sheet 3214 located at the lower side and the rear surface 433 of the guide portion 43 located at the lower side. A portion of the insertion space 41 is formed between the lower surface 431 and the upper surface 432, and each guide portion 43 has a chamfer, thus providing guidance for the mating component 400. A height of the lowest point of the front end surface 3215 of the first connecting sheet 3214 located at the upper side is equal to a height of the lower surface 431, and a height of the highest point of the front end surface 3215 of the first connecting sheet 3214 located at the lower side is equal to a height of the upper surface 432. In other embodiments, the height of the lowest point of the front end surface 3215 of the first connecting sheet 3214 located at the upper side may be greater than the height of the lower surface 431, and the height of the highest point of the front end surface 3215 of the first connecting sheet 3214 located at the lower side may be less than the height of the upper surface 432. The rear surface 433 is located in front of the corresponding reserved space 42.

Referring to FIG. 3 and FIG. 4, the two mounting portions 44 are located at a left side and a right side of the shell 4, and are used for mounting the connector 200 onto the circuit board 300. An accommodating area 441 is formed between the two mounting portions 44. Each mounting portion 44 has a rear end surface 442, and the accommodating area 441 is located in front of the rear end surface 442. The first soldering portion 314 and the conducting section 323 extend backward to be exposed in air so as to enter the accommodating area 441. The second connecting sheet 3233 is located in the accommodating area 441 and located in front of the rear end surface 442. A third gap L3 is provided between the second protruding portion 3234 and the mounting portion 44 in the transverse direction.

Referring to FIG. 2 to FIG. 4, the circuit board 300 is clamped between the terminal 3 in the upper row and the terminal 3 in the lower row, and is placed in a groove of the mounting portion 44. The second connecting sheet 3233 and the circuit board 300 have a gap in a height direction and form an angle α. The circuit board 300 has a plurality of first solder pads 301, a second solder pad 302 extending in the transverse direction, and a plurality of third solder pads 303 arranged at intervals with the first solder pads 301. Each first soldering portion 314 and each second soldering portion 3231 are correspondingly soldered to one of the third solder pads 303 and one of the first solder pads 301 respectively. A length of each first solder pad 301 is greater than a length of a third solder pad 303. Each first solder pad 301 extends backward to pass beyond the corresponding third solder pad 303, and rear ends of the first solder pads 301 are electrically connected to each other through the second solder pad 302. The first solder pads 301, the second solder pad 302 and the third solder pads 303 are located in the accommodating area 441 and located in front of the rear end surface 442.

Figure 5:
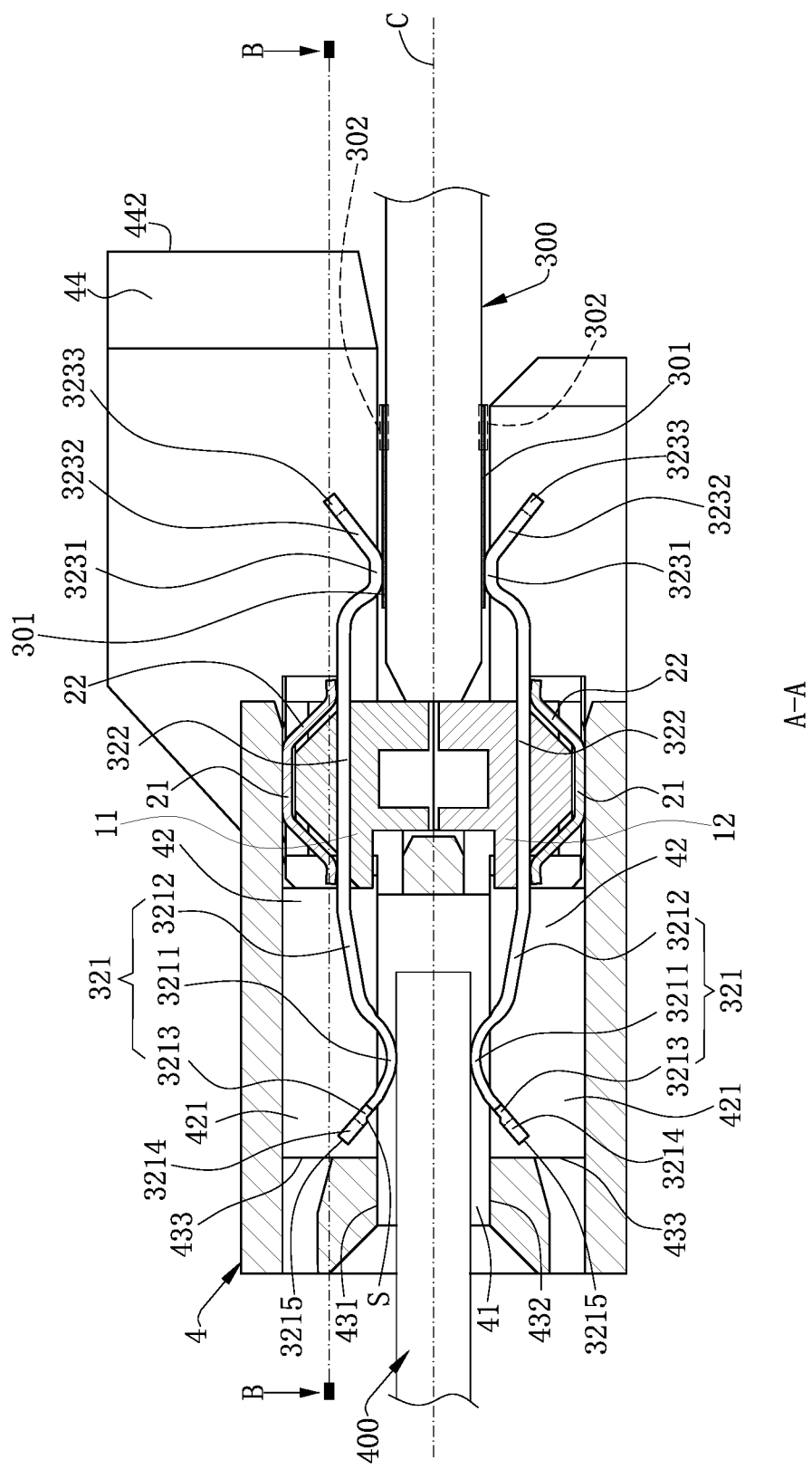
FIG. 5 is a sectional view of FIG. 3 in an A-A direction after a mating component is inserted thereto.
Figure 6:
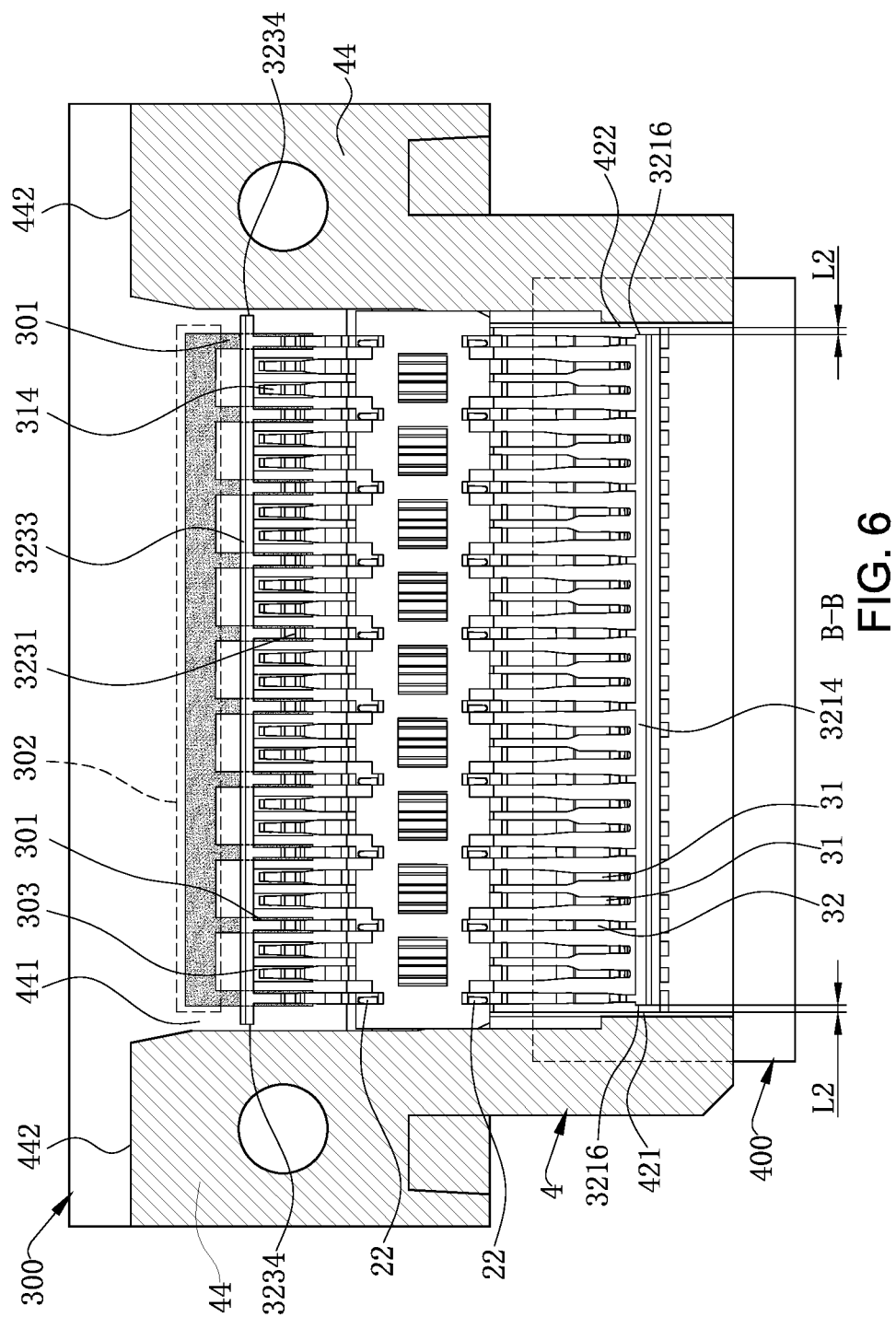
FIG. 6 is a sectional view of FIG. 5 in a B-B direction.

Referring to FIG. 5 and FIG. 6, mating of the connector 200 with the mating component 400 is completed. At this time, the mating component 400 is inserted into a mating space 41 to be in electrical contact with the first contact portion 311 and the second contact portion 3211, such that the second contact portion 3211 moves in a direction toward the corresponding reserved space 42. In this case, a first connecting sheet 3214 located at the upper side completely enters the reserved space 42, and it is shown that there is still a gap between the lowest point of the front end surface 3215 and the rear surface 433. Therefore, it is easy to know that in a whole mating process, the front end surface 3215 is not in contact with the corresponding guide portion 43. A second gap L2 is provided between one of the first protruding portions 3216 and the left inner wall surface 421, and another second gap L2 is provided between the other of the first protruding portions 3216 and the right inner wall surface 422. In the whole mating process, the first connecting sheet 3214 only moves in the vertical direction, such that the second gaps L2 are maintained between the first protruding portions 3216 and the left inner wall surface 421 as well as the right inner wall surface 422 in the whole mating process, and the first protruding portions 3216 are not in contact with the shell 4.

Figure 7:
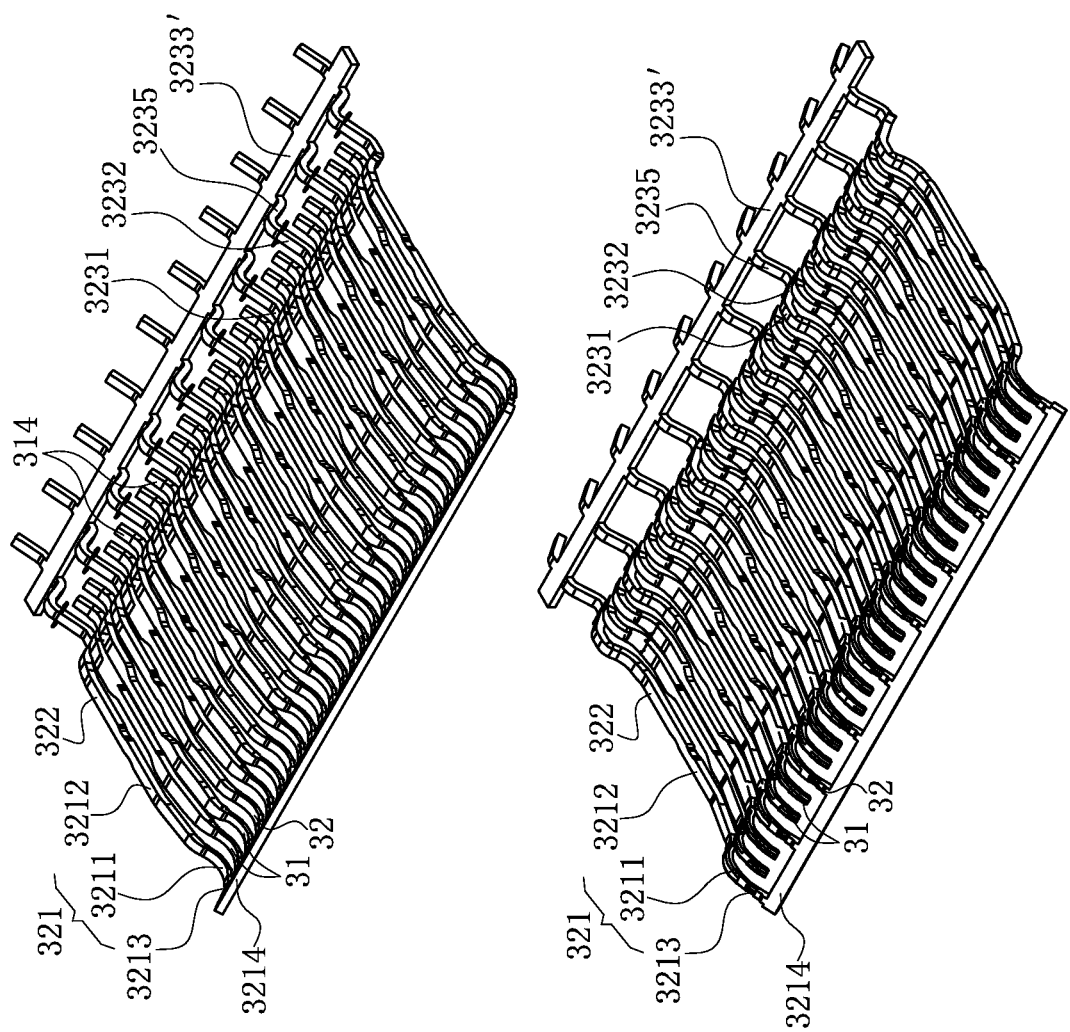
FIG. 7 is a perspective exploded view of a terminal according to a second embodiment of the present invention.
Figure 8:
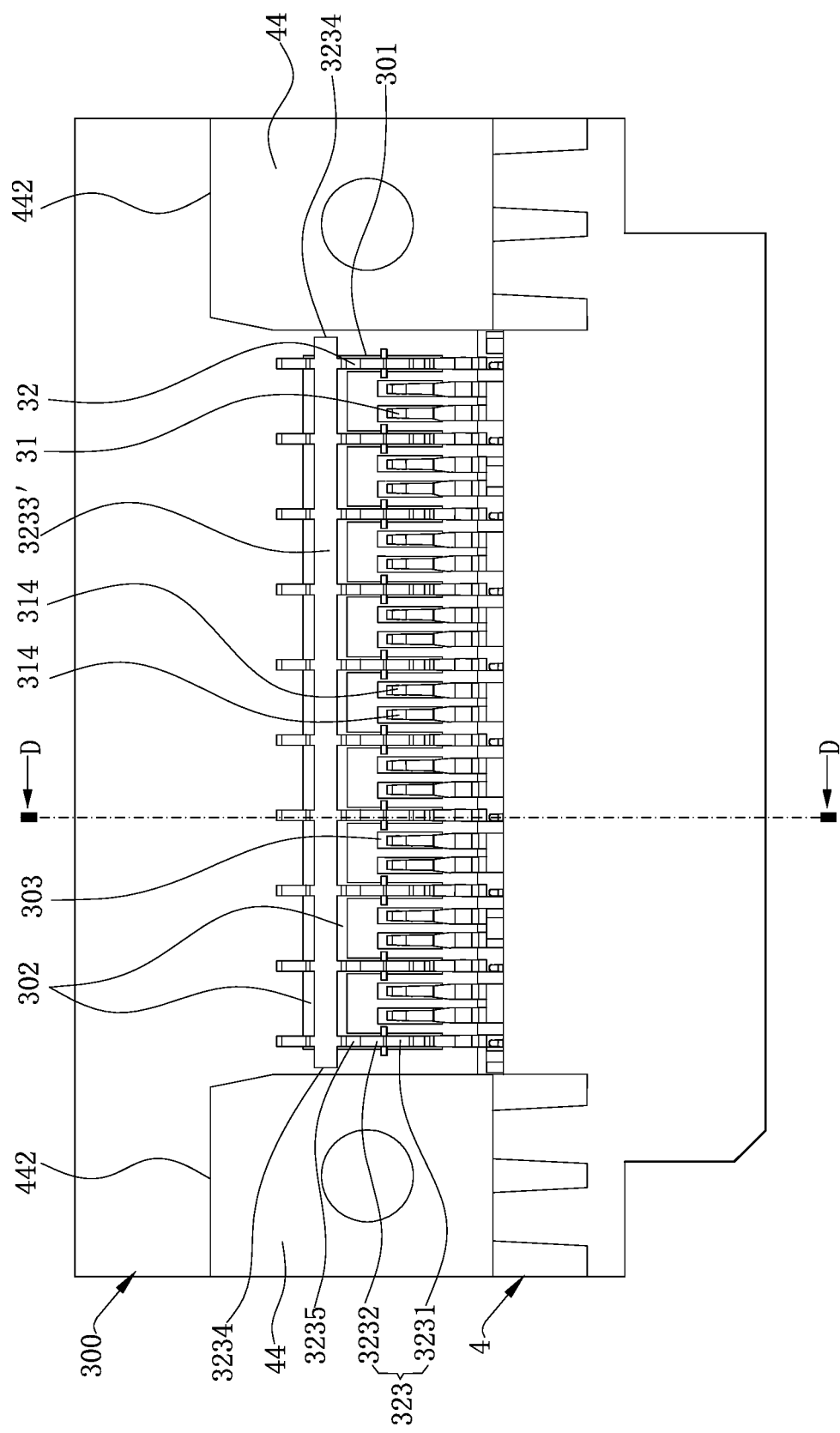
FIG. 8 is a top view of electrical connector according to the second embodiment of the present invention after a mating component is inserted thereto.
Figure 9:
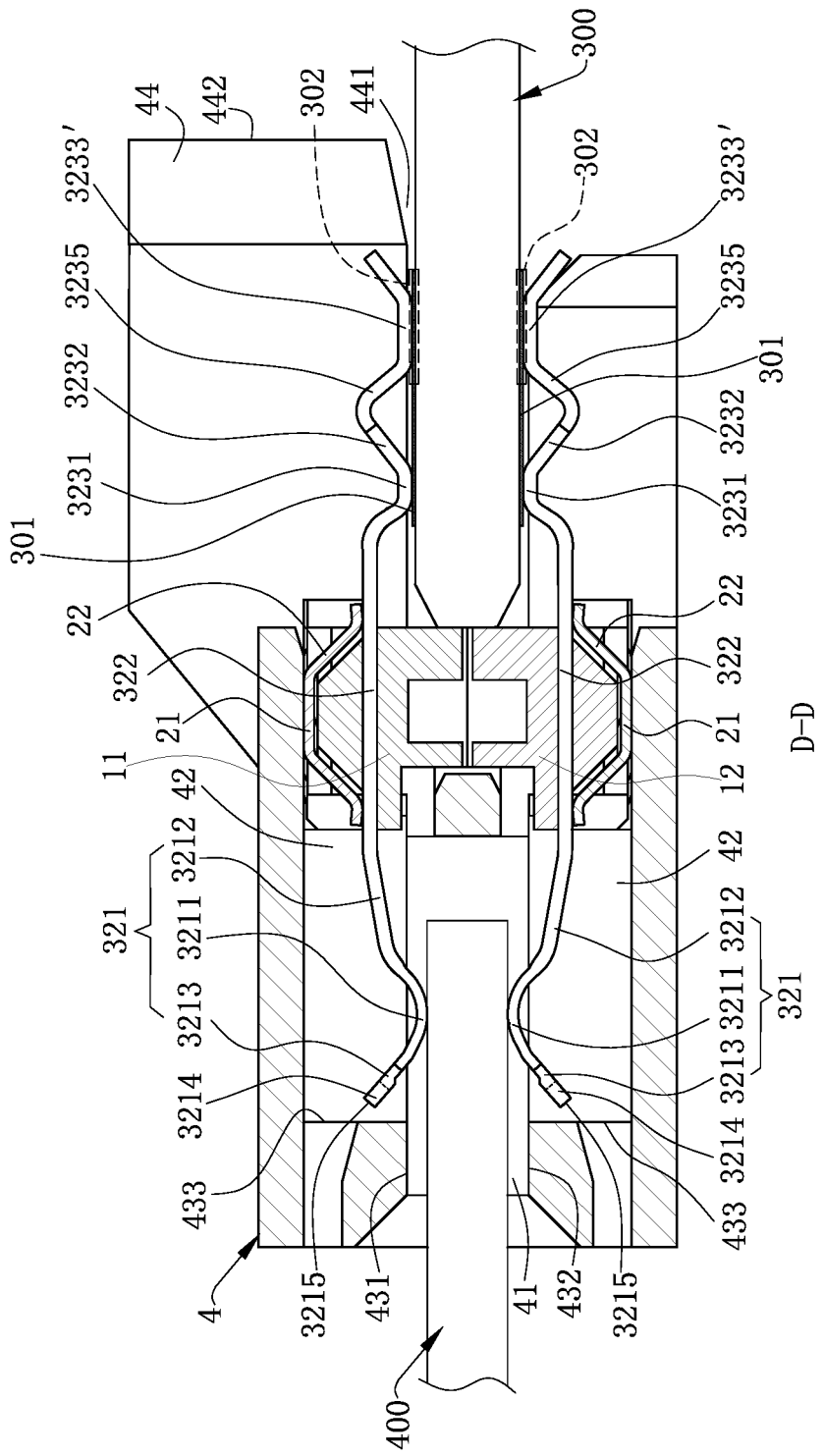
FIG. 9 is a sectional view of FIG. 8 in a D-D direction.

Referring to FIG. 7 to FIG. 9, which show an electrical connector assembly 100 according to a second embodiment of the present invention. The difference between the second embodiment and the first embodiment exists in that each tail portion 3232 further bends and extends backward to form a bending portion 3235, and multiple bending portions 3235 are connected through a second connecting sheet 3233'. The second connecting sheet 3233' is attached to a surface of the second solder pad 302 through soldering, and a width of the second solder pad 302 is greater than a width of the second connecting sheet 3233'. In other embodiments, the width of the second solder pad 302 may also be equal to the width of the second connecting sheet 3233', and the second connecting sheet 3233' and the second solder pad 302 are located in the accommodating area 441 and located in front of a rear end surface 442.

To sum up, the electrical connector assembly 100 according to certain embodiments of the present invention has the following beneficial effects:

(1) The first connecting sheet 3214 and the second connecting sheet 3233 are provided for the ground terminals 32, and the second solder pad 302 is provided on the circuit board 300 so as to electrically connect the first solder pads 301 to which the ground terminals 32 are soldered, thus providing a plurality of joint grounding paths for the ground terminals 32, manufacturing is easy, and the high frequency effect can be remarkably improved.

(2) The first connecting sheet 3214 and the second connecting sheet 3233 are integrally formed with the ground terminals 32 in the stamping process, and manufacturing is easy.

(3) The height of the lowest point of the front end surface 3215 is not lower than the height of the lower surface 431, ensuring the mating component 400 to be smoothly inserted therein without colliding with the first connecting sheet 3214 and causing the first connecting sheet 3214 to be consequently damaged.

(4) The first connecting sheet 3214 is located in the corresponding reserved space 42, and the first gap L1 is provided between the first connecting sheet 3214 and the rear surface 433, ensuring that when the mating component 400 is inserted into the insertion space 41, the first connecting sheet 3214 can normally move vertically without interfering with the shell 4 and causing the first connecting sheet 3214 to be consequently damaged.

(5) Similarly, the second gaps L2 are maintained between the first protruding portions 3216 and the left inner wall surface 421 as well as the right inner wall surface 422, ensuring that when the mating component 400 is inserted into the insertion space 41, the first connecting sheet 3214 can normally move vertically without interfering with the shell 4 and causing the first connecting sheet 3214 to be consequently damaged.

(6) The third gap L3 is maintained between the second protruding portion 3234 and the mounting portion 44, ensuring that in a clamping process that the circuit board 300 is clamped by the first soldering portions 314 and the conducting sections 323 in the upper row and the lower row, the soldering portions 314 and the conducting sections 323 can normally deform and expand without interfering with the shell 4 and consequently causing the first soldering portions 314 and the conducting sections 323 not to rebound after clamping the circuit board 300.

(7) The second solder pad 302 and the second connecting sheet 3233 are located in front of the rear end surface 442, reserving a sufficient space for mounting other elements or connectors on the circuit board 200, and ensuring that the second connecting sheet 3233 is not damaged by colliding with other elements mounted on the circuit board 200.

(8) The width of the second solder pad 302 is not less than that of the second connecting sheet 3233, ensuring the second connecting sheet 3233 to be firmly soldered to the circuit board 200 and a better grounding effect.

(9) The high frequency characteristics are affected by various factors, one of which is impedance. The step portion S is provided for the end head 3213, which is equivalent to thinning of the terminal 3, thus achieving the effects of adjusting the impedance and improving high frequency.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector assembly, mated with a mating component, the electrical connector assembly comprising:
a circuit board; and
a connector, electrically connected to the circuit board, wherein the connector comprises an insulating body and a plurality of terminals, the terminals are fixed to the insulating body and comprise at least two ground terminals, each of the ground terminals comprises a contact section extending forward and a conducting section extending backward, the contact sections of the ground terminals are connected to each other through a first connecting sheet, and the conducting sections of the ground terminals are fixed to the circuit board and are electrically connected to each other through a path on the circuit board,
wherein the connector further comprises a shell to accommodate the insulating body and the terminals, the shell has an insertion space and a reserved space located at one side of the insertion space, the insulating body is located behind the insertion space, the contact sections of the ground terminals extend forward from the reserved space to enter the insertion space, the first connecting sheet is connected to a front end of each of the contact sections of the ground terminals and enters the insertion space, a guide portion is provided in front of the reserved space, the guide portion and the reserved space are located at a same side of the insertion space, and a first gap is provided between the first connecting sheet and a rear surface of the guide portion.

2. The electrical connector assembly according to claim 1, wherein the first connecting sheet and the ground terminals are integrally formed.

3. The electrical connector assembly according to claim 1, wherein the reserved space and the guide portion are located at an upper side of the insertion space, and a lowest point of a front end surface of the first connecting sheet is not lower than a lower surface of the guide portion.

4. The electrical connector assembly according to claim 1, wherein the reserved space extends in a transverse direction, an end of the first connecting sheet in the transverse direction has a first protruding portion, and when the mating component is inserted into the insertion space, a second gap is provided between an inner wall surface of the reserved space located at an end thereof in the transverse direction and the first protruding portion.

5. The electrical connector assembly according to claim 1, wherein the shell has a mounting portion, the conducting section of each of the ground terminals comprises a soldering portion and a tail portion extending from a rear end of the soldering portion, the tail portions of the ground terminals are connected to each other through a second connecting sheet, the second connecting sheet has a second protruding portion in a transverse direction, and a third gap is provided between the second protruding portion and the mounting portion in the transverse direction.

6. The electrical connector assembly according to claim 1, wherein the contact section of each of the ground terminals comprises a second contact portion, the second contact portion is electrically connected to the mating component, and a thickness of the first connecting sheet is different from a thickness of the second contact portion.

7. The electrical connector assembly according to claim 6, wherein the thickness of the first connecting sheet is greater than the thickness of the second contact portion.

8. The electrical connector assembly according to claim 1, wherein the terminals comprise at least a pair of differential signal terminals, the differential signal terminals are located between two of the ground terminals, and the first connecting sheet is located in front of the differential signal terminals.

9. An electrical connector assembly, mated with a mating component, the electrical connector assembly comprising:
a circuit board; and
a connector, electrically connected to the circuit board, wherein the connector comprises an insulating body and a plurality of terminals, the terminals are fixed to the insulating body and comprise at least two ground terminals, each of the ground terminals comprises a contact section extending forward and a conducting section extending backward, the contact sections of the ground terminals are connected to each other through a first connecting sheet, and the conducting sections of the ground terminals are fixed to the circuit board and are electrically connected to each other through a path on the circuit board,
wherein the terminals are arranged in an upper row and a lower row, each of the terminals in the upper row and the terminals in the lower row comprise at least two ground terminals, the contact sections of the at least two ground terminals in the upper row are connected to each other through a first connecting sheet in the upper row, the contact sections of the at least two ground terminals in the lower row are connected to each other through a first connecting sheet in the lower row, and the first connecting sheet located in the upper row and the first connecting sheet located in the lower row are symmetrically provided.

10. The electrical connector assembly according to claim 1, wherein the circuit board has a plurality of first solder pads and a second solder pad, the conducting section of each of the ground terminals is correspondingly soldered to one of the first solder pads, and the first solder pads are electrically connected to each other through the second solder pad to provide the path.

11. The electrical connector assembly according to claim 10, wherein the connector comprises a shell to accommodate the insulating body and the terminals, a rear end of the shell has a mounting portion, and the second solder pad is located in front of a rear end surface of the mounting portion.

12. The electrical connector assembly according to claim 10, wherein the conducting sections of the ground terminals are connected to each other through a second connecting sheet, and the second connecting sheet is located on the second solder pad.

13. The electrical connector assembly according to claim 9, wherein the contact section of each of the ground terminals comprises a second contact portion, the second contact portion is electrically connected to the mating component, and a thickness of the first connecting sheet is different from a thickness of the second contact portion.

14. The electrical connector assembly according to claim 13, wherein the thickness of the first connecting sheet is greater than the thickness of the second contact portion.

15. The electrical connector assembly according to claim 9, wherein the terminals comprise at least a pair of differential signal terminals, the differential signal terminals are located between two of the ground terminals, and the first connecting sheet is located in front of the differential signal terminals.

16. The electrical connector assembly according to claim 9, wherein the circuit board has a plurality of first solder pads and a second solder pad, the conducting section of each of the ground terminals is correspondingly soldered to one of the first solder pads, and the first solder pads are electrically connected to each other through the second solder pad to provide the path.

17. An electrical connector assembly, mated with a mating component, the electrical connector assembly comprising:
a circuit board; and
a connector, electrically connected to the circuit board, wherein the connector comprises an insulating body and a plurality of terminals, the terminals are fixed to the insulating body and comprise at least two ground terminals, each of the ground terminals comprises a contact section extending forward and a conducting section extending backward, the contact sections of the ground terminals are connected to each other through a first connecting sheet, and the conducting sections of the ground terminals are fixed to the circuit board and are electrically connected to each other through a path on the circuit board,
wherein the conducting section of each of the ground terminals comprises a soldering portion and a tail portion extending from a rear end of the soldering portion, the tail portions of the ground terminals are connected to each other through a second connecting sheet, and an angle is formed between the second connecting sheet and the circuit board or the second connecting sheet is attached to a surface of the circuit board.

18. The electrical connector assembly according to claim 17, wherein the circuit board has a plurality of first solder pads and at least one second solder pad, each conducting section of each of the ground terminals is correspondingly soldered to one of the first solder pads, and the first solder pads are electrically connected to each other through the second solder pad so as to provide the path.

19. The electrical connector assembly according to claim 18, wherein a width of the second solder pad is not less than a width of the second connecting sheet.

20. The electrical connector assembly according to claim 17, wherein the contact section of each of the ground terminals comprises a second contact portion, the second contact portion is electrically connected to the mating component, and a thickness of the first connecting sheet is different from a thickness of the second contact portion.

* * * * *